United States Patent
Penmethsa et al.

(10) Patent No.: US 11,881,427 B2
(45) Date of Patent: Jan. 23, 2024

(54) SUBSTRATE FLIPPING IN VACUUM FOR DUAL SIDED PVD SPUTTERING

(71) Applicant: Applied Materials, Inc., Santa Clara, CA (US)

(72) Inventors: Harish Penmethsa, Dublin, CA (US); Suresh Palanisamy, Coimbatore (IN); Dinesh Rajamanickam, Coimbatore (IN); Naresh Kumar Asokan, Coimbatore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 113 days.

(21) Appl. No.: 17/493,283

(22) Filed: Oct. 4, 2021

(65) Prior Publication Data

US 2023/0103481 A1     Apr. 6, 2023

(51) Int. Cl.
| | |
|---|---|
| *H01L 21/687* | (2006.01) |
| *C23C 14/34* | (2006.01) |
| *C23C 14/56* | (2006.01) |
| *B65G 47/248* | (2006.01) |

(52) U.S. Cl.
CPC ...... *H01L 21/68764* (2013.01); *B65G 47/248* (2013.01); *C23C 14/34* (2013.01); *C23C 14/566* (2013.01); *H01L 21/68728* (2013.01)

(58) Field of Classification Search
CPC ......... H01L 21/68764; H01L 21/68728; C23C 14/34; C23C 14/566; B65G 47/248
See application file for complete search history.

(56) References Cited

U.S. PATENT DOCUMENTS

| | | | |
|---|---|---|---|
| 2013/0062013 A1* | 3/2013 | Okada | H01L 21/68707 |
| | | | 156/322 |
| 2018/0174873 A1* | 6/2018 | Miller | C23C 16/06 |
| 2020/0006107 A1* | 1/2020 | Pretscher | H01L 21/67769 |

FOREIGN PATENT DOCUMENTS

| | | | |
|---|---|---|---|
| CN | 212335277 U | | 1/2021 |
| JP | 2011-063845 A | | 3/2011 |
| KR | 10-2007-0093746 A | * | 9/2007 |
| KR | 10-2007-0093746 A | | 9/2007 |
| KR | 10-2013-0088536 A | * | 8/2013 |
| KR | 10-2013-0088536 A | | 8/2013 |

OTHER PUBLICATIONS

International Search Report dated Dec. 6, 2022 for Application No. PCT/US2022/041389.
Written Opinion dated Dec. 6, 2022 for Application No. PCT/US2022/041389.

* cited by examiner

*Primary Examiner* — Gerald McClain
(74) *Attorney, Agent, or Firm* — Patterson + Sheridan, LLP

(57) ABSTRACT

A module of a processing system for flipping a substrate in vacuum includes a clamp assembly for securing the substrate, a first motor assembly coupled to the clamp assembly for rotating the clamp assembly, and a second motor assembly coupled to the first motor assembly for raising and lowering the first motor assembly and the clamp assembly.

18 Claims, 18 Drawing Sheets

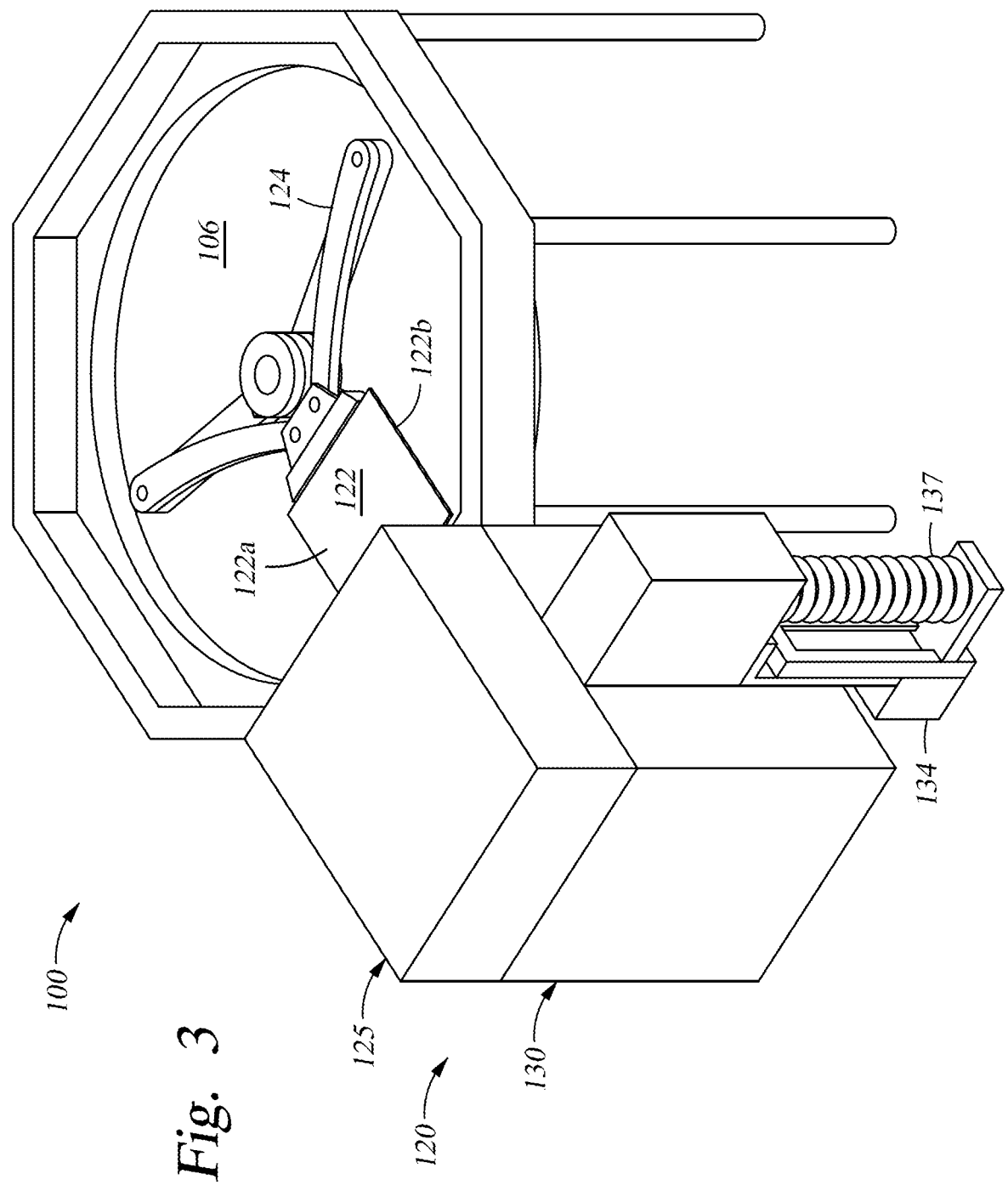

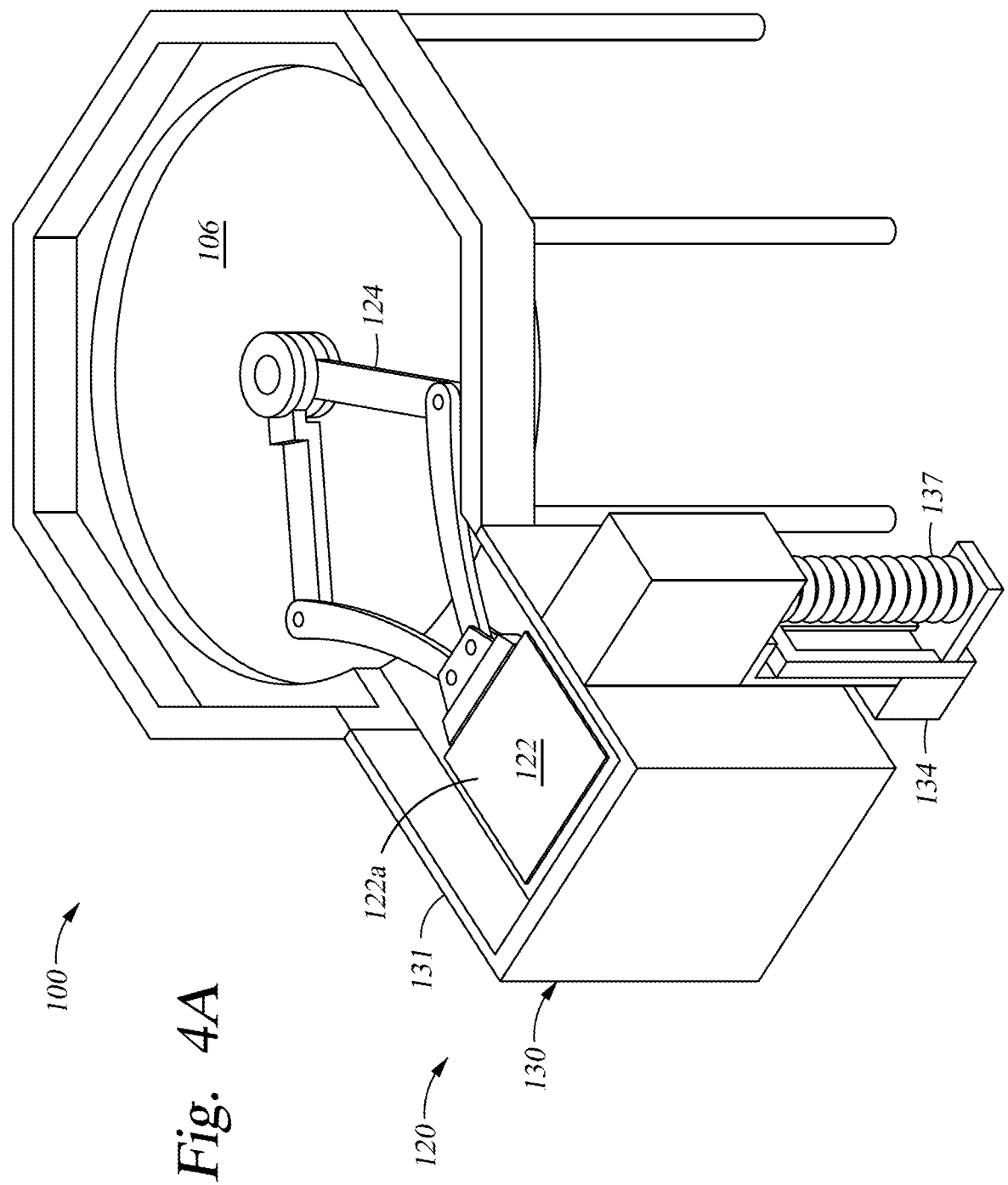

SUBSTRATE FLIPPING IN VACUUM FOR DUAL SIDED PVD SPUTTERING

BACKGROUND

Field

Embodiments of the present disclosure generally relate to dual sided physical vapor deposition (PVD) sputtering of substrates in an electronic device fabrication process, and more particularly, to apparatus and methods for flipping substrates in vacuum between PVD sputtering of each side.

Description of the Related Art

Substrate processing in electronic device fabrication often involves performing a deposition process on both sides of a substrate. However, process chambers are typically designed for depositing material on only one surface at a time, such as on the upper or lower surface of the substrate. Therefore, it is often necessary to flip or reorient the substrate in relation to the chamber between deposition processes.

This is a particular challenge when processing some large-area substrates, such as panels. As used herein, the term "panel" may refer to a large-area substrate that contains a large surface area of polymer material. For example, a common panel size may be 600 mm by 600 mm. Common panel materials can include Ajinomoto Build-up Film (ABF), Copper Clad Laminate (CCL), panel with polymer on top, glass, etc. Because of the large surface area of the polymer material on the panels, the panels absorb a lot of moisture. Therefore, to achieve good contact resistance a very efficient degas is required to remove all outgassing from the panels and remove contamination.

In order to perform PVD sputtering on both sides of a substrate/panel, the substrate/panel is removed from vacuum chambers of a cluster tool and flipped in atmosphere. When this is done, an additional degassing operation is required to remove moisture absorbed on the substrate/panel. Since degassing can take tens of minutes, such as about 40 minutes in some cases, this additional degassing operation very negatively affects throughput.

There have been attempts to hold substrates/panels vertically in the PVD chamber in order to sputter from both sides simultaneously. However, with this approach, there is no active cooling to the substrate/panel and undesirable arcing can occur.

Accordingly, there is a need in the art for apparatus and methods for flipping substrates in vacuum between PVD sputtering of each side.

SUMMARY

Embodiments described herein generally relate to dual sided physical vapor deposition (PVD) sputtering of substrates in an electronic device fabrication process. More particularly, embodiments described herein provide apparatus and methods for flipping substrates in vacuum between PVD sputtering of each side.

In one embodiment, a processing system includes a deposition chamber, a transfer chamber coupled to the deposition chamber, and a load lock chamber coupled to the transfer chamber, the load lock chamber having a module for flipping a substrate in vacuum.

In another embodiment, a module of a processing system for flipping a substrate in vacuum includes a clamp assembly for securing a substrate, a first motor assembly coupled to the clamp assembly for rotating the clamp assembly, and a second motor assembly coupled to the first motor assembly for raising and lowering the first motor assembly and the clamp assembly.

In another embodiment, a method of flipping a substrate includes receiving the substrate in a load lock chamber, the load lock chamber having a module for flipping the substrate, and the method includes flipping the substrate in vacuum.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3 is a schematic top isometric view of a portion of the substrate processing system of FIG. 1 including a flipper module, according to certain embodiments FIG. 4A is a schematic top isometric view of a portion of the substrate processing system of FIG. 1 including the flipper module, according to certain embodiments.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Embodiments described herein generally relate to dual sided physical vapor deposition (PVD) sputtering of substrates in an electronic device fabrication process. More particularly, embodiments described herein provide apparatus and methods for flipping substrates in vacuum between PVD sputtering of each side.

Embodiments described herein enable PVD sputtering on both sides of a substrate without removing the substrate from vacuum, in contrast to conventional approaches in which the substrates are removed from vacuum and flipped in atmosphere. Performing this process in vacuum eliminates an additional degassing operation and increases throughput.

Embodiments described herein enable PVD sputtering on both sides of a substrate without holding the substrate vertically. Performing sputtering on the substrate positioned horizontally enables active cooling and prevents undesirable arcing.

Embodiments described herein provide apparatus for flipping substrates in vacuum within a load lock chamber without increasing a footprint of either existing or new processing systems. Embodiments described herein enable flipping of large area substrates in vacuum in addition to conventional substrates.

Exemplary Substrate Processing System

Figure 1:
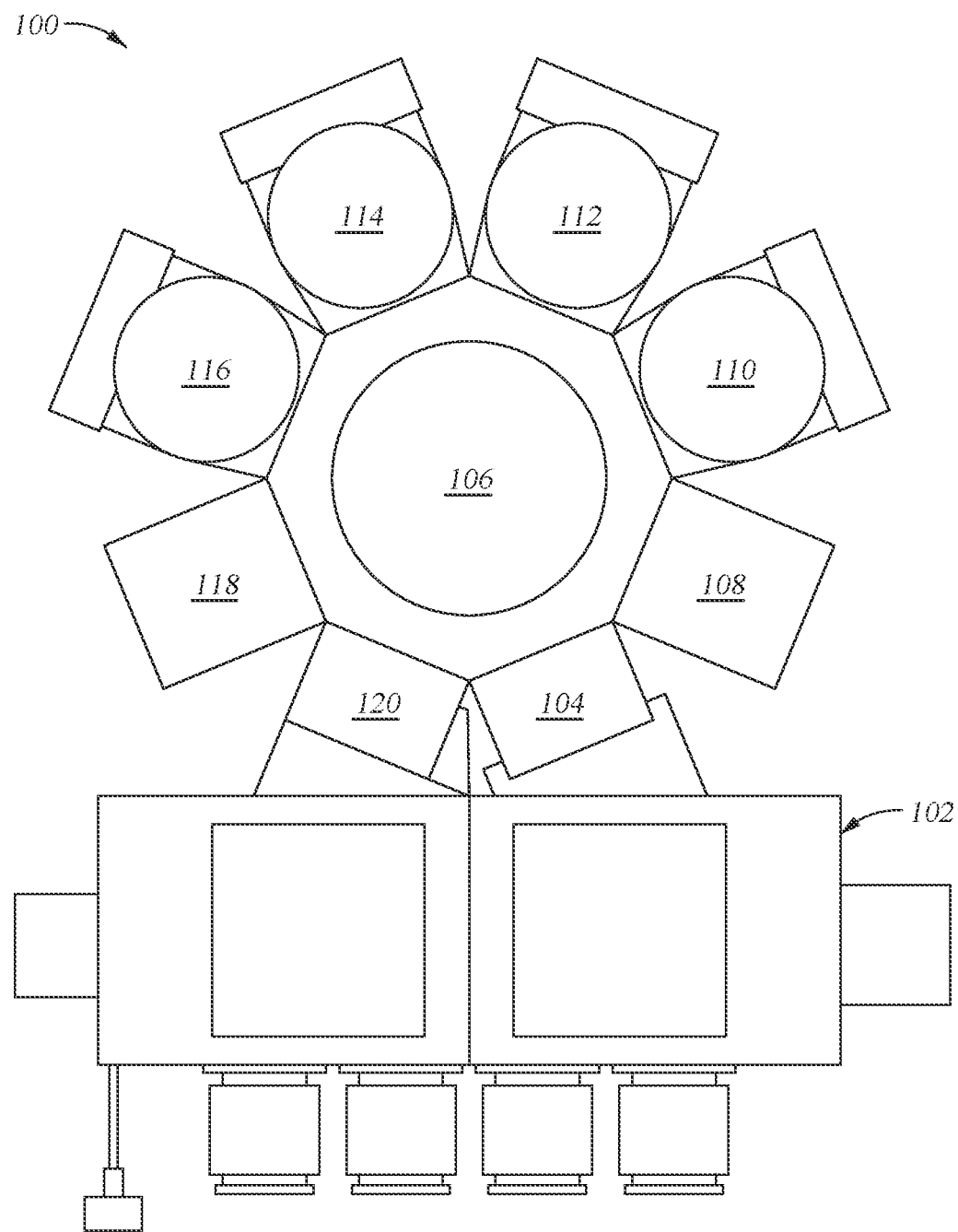
FIG. 1 is a schematic top view of an exemplary substrate processing system, according to certain embodiments.

FIG. 1 is a schematic top view of an exemplary substrate processing system 100 (also referred to as a "processing platform"), according to certain embodiments. In certain embodiments, the substrate processing system 100 is particularly configured for processing large-area substrates, such as panels as described above. The substrate processing system 100 generally includes an equipment front-end module (EFEM) 102 for loading substrates into the processing system 100, a first load lock chamber 104 coupled to the EFEM 102, a transfer chamber 106 coupled to the first load lock chamber 104, and a plurality of other chambers coupled to the transfer chamber 106 as described in detail below. Proceeding counterclockwise around the transfer chamber 106 from the first load lock chamber 104, the processing system 100 includes a first dedicated degas chamber 108, a first pre-clean chamber 110, a first deposition chamber 112, a second pre-clean chamber 114, a second deposition chamber 116, a second dedicated degas chamber 118, and a second load lock chamber 120. The second load lock chamber 120 includes a flipper module for flipping a substrate in vacuum, as described in more detail below. In certain embodiments, the vacuum is created using a turbomolecular pump coupled to the second load lock chamber 120. However, other types of vacuum pumps are also contemplated. In certain embodiments, the transfer chamber 106 and each chamber coupled to the transfer chamber 106 are at vacuum. As used herein, the term "vacuum" may refer to pressures below about $10^{-2}$ Pa. However, some high-vacuum systems may operate below $10^{-5}$ Pa.

In certain embodiments, substrates are loaded into the processing system 100 through a door (also referred to as a "slit valve"), in the first load lock chamber 104 and unloaded from the processing system 100 through a door in the second load lock chamber 120. In certain embodiments, a stack of substrates is supported in a cassette, which is placed in the first load lock chamber 104. Once the first load lock chamber 104 is pumped down, one substrate at a time is retrieved from the cassette using a robot located in the transfer chamber 106. In one embodiment, the second load lock chamber 120 receives a single substrate after processing has been performed on each side and unloads the processed substrate to the EFEM 102. The second load lock chamber 120 may be a dual chamber including an upper chamber portion 125 (FIG. 3) for receiving the substrate after both sides have been processed and unloading the substrate to the EFEM 102, and a lower portion including a flipper module 130 (FIG. 3) for flipping a substrate having one side processed in order to process the other side. However, other loading and unloading configurations are also contemplated.

Pre-cleaning of the substrates is important to remove impurities, such as oxides, from the substrate surface, so that metal films deposited in the deposition chambers are not electrically insulated from the substrate. By performing pre-cleaning in the first and second pre-clean chambers 110, 114 that share the same vacuum environment as the first and second deposition chambers 112, 116, the substrates can be transferred from the cleaning chambers to the deposition chambers without being exposed to atmosphere. This prevents formation of impurities on the substrates during the transfer. In addition, vacuum pump-down cycles are reduced since a vacuum is maintained in the substrate processing system 100 during transfer of the cleaned substrates to the deposition chambers.

In certain embodiments, only one substrate is processed within each pre-clean and deposition chamber at a time. Alternatively, multiple substrates may be processed at one time, such as four to six substrates. In such embodiments, the substrates may be disposed on a rotatable pedestal within the respective chambers. In certain embodiments, the first and second pre-clean chambers 110, 114 are pre-clean etch chambers for etching the substrate surface. However, other types of pre-clean chambers are also contemplated. In certain embodiments, one or both of the pre-clean chambers are replaced with a deposition chamber for performing a reactive sputtering process, such as deposition of silicon nitride, aluminum oxide, or other materials by reactive sputtering. In an ICP chamber, a coil at the top of the chamber is energized with an external RF source to create an excitation field in the chamber. Argon gas flows through the chamber from an external gas source. The argon atoms in the chamber are ionized (charged) by the RF energy. The substrate is biased by a DC biasing source coupled to an aluminum pedestal on which the substrate sits. The charged atoms are attracted to the substrate resulting in etching of the substrate surface. Other gases besides argon may be used depending on the desired etch rate and the materials to be etched. An ionization energy level may be relatively low for etching as part of a cleaning process in contrast to a process for etching features in the substrate surface. The lower energy avoids damaging circuit devices and features already formed on the substrate.

In certain embodiments, the first and second deposition chambers 112, 116 are PVD chambers. In such embodiments, the PVD chambers may be configured to deposit copper, titanium, aluminum, gold, nickel, nickel vanadium, silver, and/or tantalum. However, other types of deposition processes and materials are also contemplated. In a PVD chamber, an entire back surface of the substrate is in electrical and thermal contact with the pedestal. Controlling the temperature of the substrate is important during the sputtering process to obtain a predictable and reliable thin film. A coolant system includes an external cooling source that supplies fluid to cooling lines in the pedestal. The cooling source may be replaced or augmented with a heating source to increase the workpiece temperature independent of the sputtering process.

In certain embodiments, an RF bias source is electrically coupled to the pedestal to energize the pedestal and thus energize the substrate for the sputtering process. Substrate bias (RF bias) may be used where the substrates/panels have features that require good step coverage, for example. Alternatively, the pedestal may be grounded, floated, or biased with only a DC voltage source.

In operation, the chamber is evacuated and back filled with argon gas. The gas is energized with a DC source to couple an electromagnetic field inside the chamber to excite a sustained high-density plasma near the target surface. The plasma confined near the target surface contains positive ions (such as Ar+) and free electrons. The ions in the plasma strike the target surface and sputter material off the target. The substrate receives the sputtered material to form a deposited layer on the substrate surface. In one example, as much as 20 kilowatts of DC power can be provided on the target enabling the target to deposit approximately 1 micron per minute of material on the substrate.

The sputtering chamber uses a magnetron assembly, outside the vacuum, to further control the bombardment of the target by the plasma. In certain embodiments, a fixed permanent magnet is located behind the target (serving as a deposition source), so that the plasma is confined to the target area. In other cases, magnets are scanned across the backside of the target to help distribute the magnetic field evenly across the target for more even target erosion. The resulting magnetic field forms a closed-loop annular path acting as an electron trap that reshapes the trajectories of the secondary electrons ejected from the target into a cycloidal path, greatly increasing the probability of ionization of the sputtering gas within the confinement zone. Inert gases, such as argon, are usually employed as the sputtering gas because they tend not to react with the target material or combine with any process gases and because they produce higher sputtering and deposition rates due to their high molecular weight. Positively charged argon ions from the plasma are accelerated toward the negatively biased target and impact the target, resulting in material being sputtered from the target surface.

The chamber wall is typically electrically grounded in processing operations. A bias voltage on the substrate can drive a flux of an electrically charged species (Ar+ and/or atomic vapor sputtered off the target) to the substrate. The flux can modify the properties, such as density, of the sputtered material on the substrate.

In certain embodiments, the chamber gas is provided by a distribution channel at the bottom of the chamber, rather than from the top, which reduces particle contamination during the sputtering process and allows optimization of the magnetron assembly.

Exemplary Flipper Module and Method of Use

Figure 2:
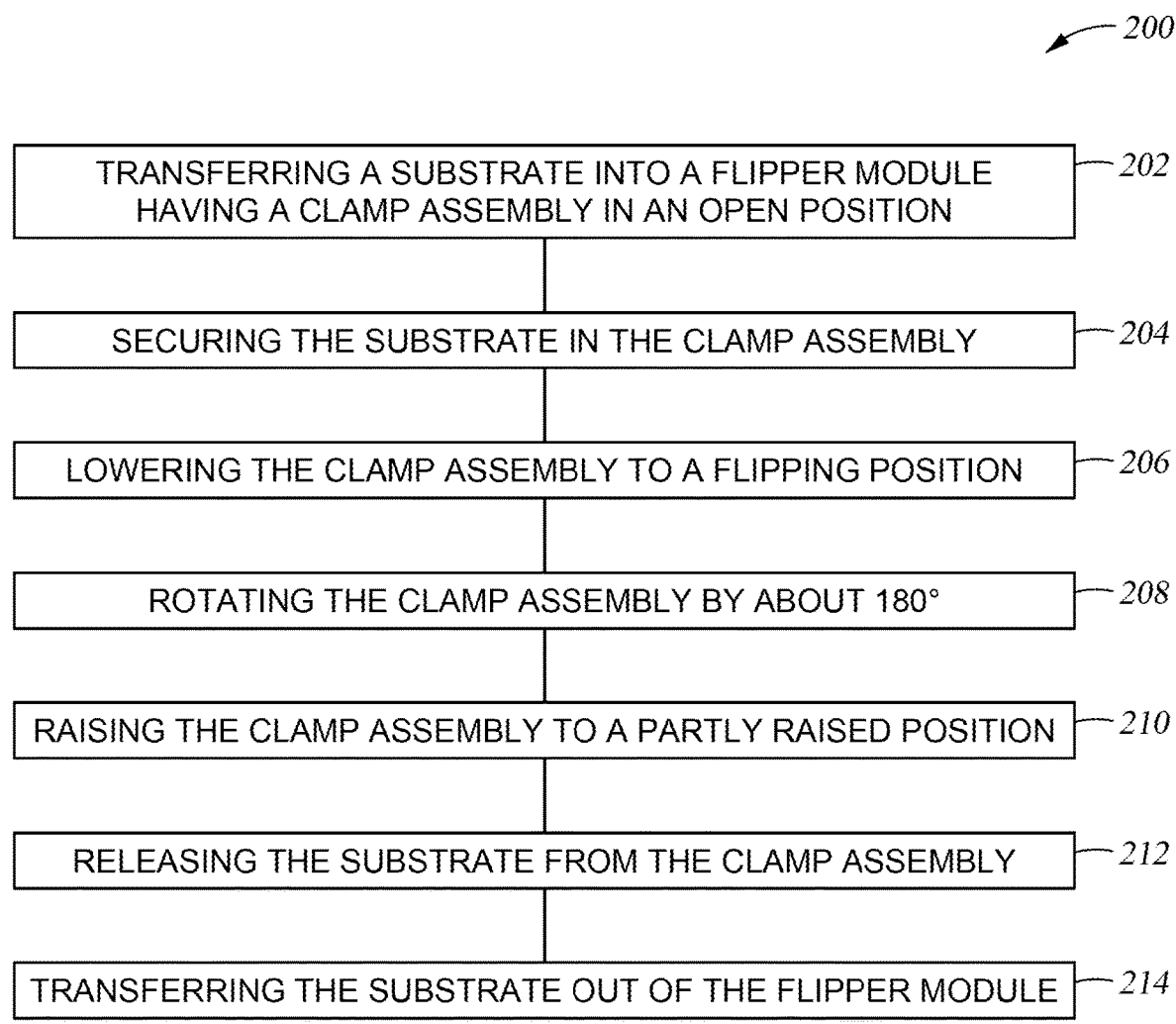
FIG. 2 is a diagram illustrating a method of flipping a substrate in vacuum using a flipper module, according to certain embodiments.

FIG. 2 is a diagram illustrating a method 200 of flipping a substrate 122 in vacuum using a flipper module 130 of the second load lock chamber 120, according to certain embodiments. FIG. 3 is a schematic top isometric view of the substrate processing system 100 of FIG. 1, according to certain embodiments. Note that in FIG. 3, only the transfer chamber 106, and the second load lock chamber 120 are shown for clarity. As shown, the load lock chamber 120 includes an upper chamber 125, which is configured to receive and unload a substrate after processing on both sides, and a lower chamber or flipper module 130 configured to receive a substrate processed on a first side and flip the substrate for processing on the second side. Also, note that an upper portion of the transfer chamber 106 is further omitted in order to illustrate an interior thereof.

In the position illustrated in FIG. 3, a substrate 122 is disposed in the transfer chamber 106. An edge of the substrate 122 is in contact with an end effector of a transfer robot 124. The substrate 122 and the end effector of the transfer robot 124 are aligned with a door of the flipper module 130 of the load lock chamber 120. In the orientation shown in FIG. 3, a front side 122a of the substrate 122 is facing upwards, and a backside 122b is supported from underneath by the end effector. In this example, the substrate 122 is a panel. However, apparatus and methods of the present disclosure may be implemented with many different types of substrates.

FIG. 4A is a schematic top isometric view of the substrate processing system 100 of FIG. 1, according to certain embodiments. As shown in FIG. 4A, at operation 202, the substrate 122 is transferred into the flipper module 130. Note that in FIG. 4A, only the transfer chamber 106 and the flipper module 130 of the second load lock chamber 120 are shown for clarity, FIG. 3. Also, note that upper portions of each chamber are further omitted in order to illustrate an interior of each respective chamber. As shown in FIG. 4A, the transfer robot 124 is actuated to move the substrate 122 from the transfer chamber 106 into a housing 131 of the flipper module 130.

Figure 4B:
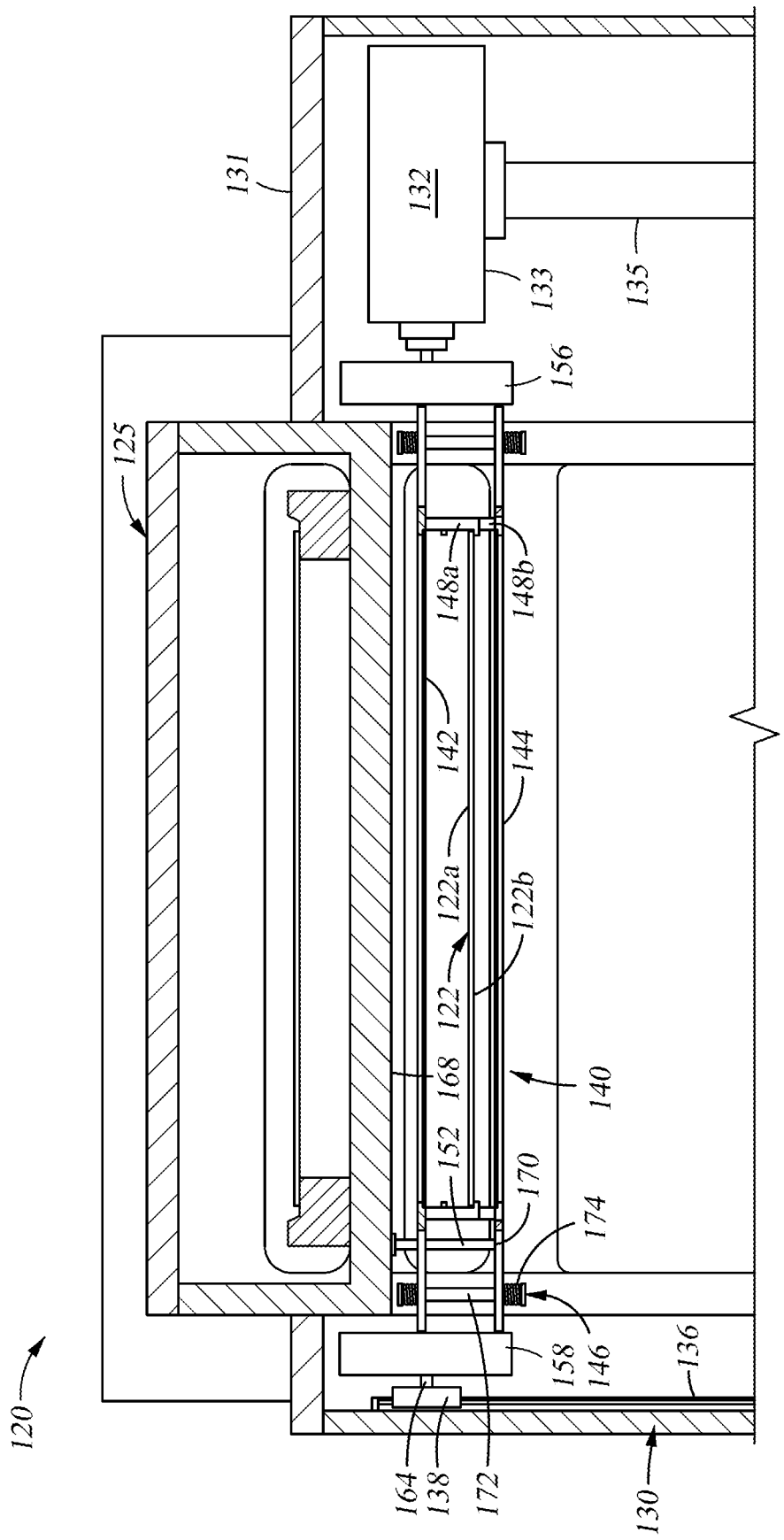
FIGS. 4B-4C are partial side cross-sectional views of the flipper module in the position shown in FIG. 4A, according to certain embodiments
Figure 4C:
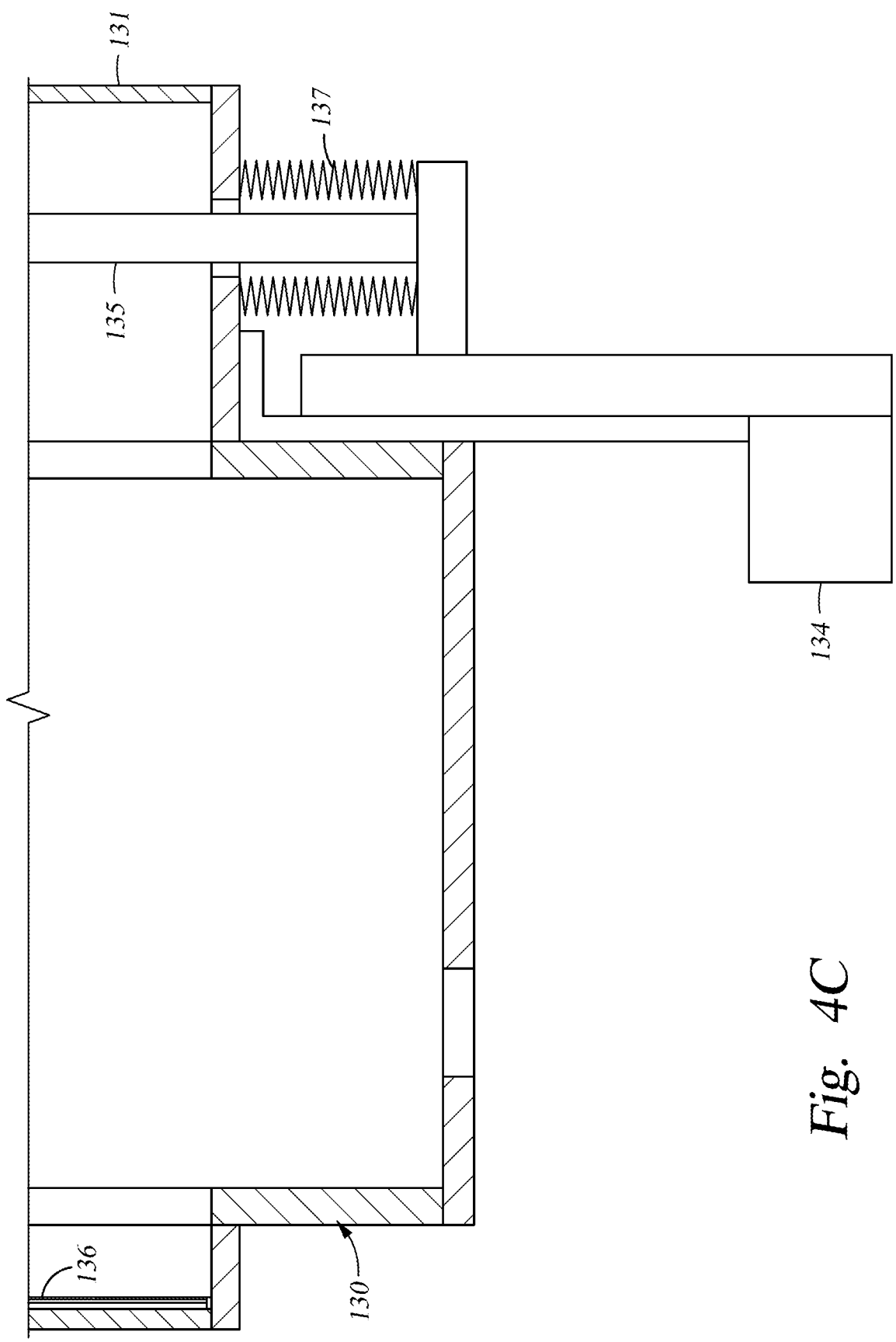

FIGS. 4B-4C are partial side cross-sectional views illustrating upper and lower portions, respectively, of the load lock chamber 120 in the position shown in FIG. 4A, according to certain embodiments. As shown in FIGS. 4B-4C, the flipper module 130 generally includes a clamp assembly 140 for securing the substrate 122, a first motor assembly 132 coupled to the clamp assembly 140 for rotating the clamp assembly 140, and a second motor assembly 134 coupled to the first motor assembly 132 for raising and lowering the first motor assembly 132 and the clamp assembly 140. A first guide block 156 is coupled between the clamp assembly 140 and the first motor assembly 132. A second guide block 158 is coupled to the clamp assembly 140 opposite the first motor assembly 132. An actuator 135 of the second motor assembly 134 is coupled to a body 133 of the first motor assembly 132 to raise and lower the first motor assembly 132. As shown in FIGS. 4B-4C, the actuator 135 and thus the clamp assembly 140 are in a fully raised position (also referred to as a "loading position"). The actuator 135 and the body 133 are each disposed in vacuum, whereas the second motor assembly 134 is disposed in atmosphere. To maintain vacuum within the housing 131 of the flipper module 130, a bellows 137 surrounds the actuator 135 and forms a seal between the housing 131 and the second motor assembly 134.

The clamp assembly 140 includes a first plate 142 and a second plate 144 parallel to the first plate 142. As shown in FIG. 4B, the clamp assembly 140 is in an open position in which the first and second plates 142, 144 are spaced apart from each other. A pair of lift pins 152 are configured to contact one of the first or second plates 142, 144 for moving the clamp assembly 140 to the open position as described in more detail below. The pair of lift pins 152 are coupled to an upper surface 168 of the housing 131. Although only one lift pin is shown in the cross-section of FIG. 4B, a second lift pin is located diagonally across the housing 131. The pair of lift pins 152 extend downward from the upper surface 168 to a lower end 170 that contacts corresponding tabs 154a-b (shown in FIG. 4E) located at opposite corners of the respective first and second plates 142, 144. In the orientation shown in FIG. 4B, the pair of lift pins 152 contact the second plate 144 to hold the second plate 144 in a fixed position in relation to the upper surface 168 as the first plate 142 is moved further upwards by the second motor assembly 134 as shown in more detail in FIG. 4D.

Figure 4D:
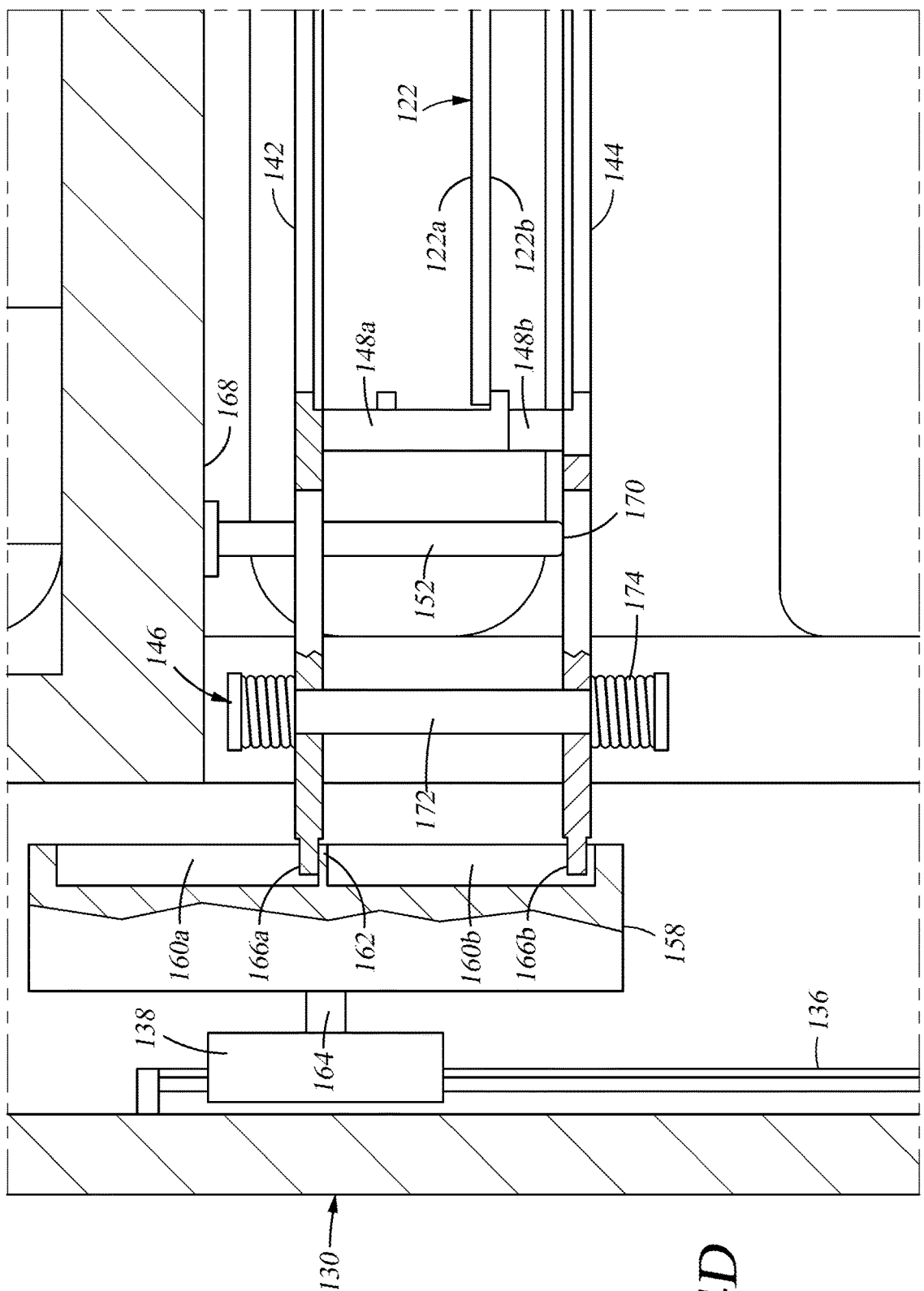
FIG. 4D is an enlarged view of a portion of FIG. 4B, according to certain embodiments.

FIG. 4D is an enlarged view of a portion of FIG. 4B, according to certain embodiments. As shown in more detail FIG. 4D, the flipper module 130 includes a slide 136 having a bearing support 138. The slide 136 is coupled to the clamp assembly 140 through the bearing support 138 and the second guide block 158 opposite the first motor assembly 132. The bearing support 138 supports rotation of the clamp assembly 140 by the first motor assembly 132 through a rotatable bearing 164. The bearing support 138 is movable on the slide 136 to support raising and lowering of the clamp assembly 140 by the second motor assembly 134. When the second load lock chamber 120 is at vacuum, the clamp assembly 140, the first motor assembly 132, and the slide 136 are each disposed in vacuum.

The second guide block 158 is coupled between the clamp assembly 140 and the bearing support 138. The second guide block 158 has a first slot 160a that fits a corresponding pin 166a on the first plate 142 and a second slot 160b, aligned with the first slot 160a, that fits a corresponding pin 166b on the second plate 144. The first and second slots 160a-b are separated by a wall 162. As shown in FIG. 4D, contact between the pin 166a of the first plate 142 and the wall 162 causes the first plate 142 to move further upwards even after the second plate 144 is stopped after contacting the pair of lift pins 152. In certain embodiments, the first and second guide blocks 156, 158 are structurally and functionally equivalent.

Figure 4E:
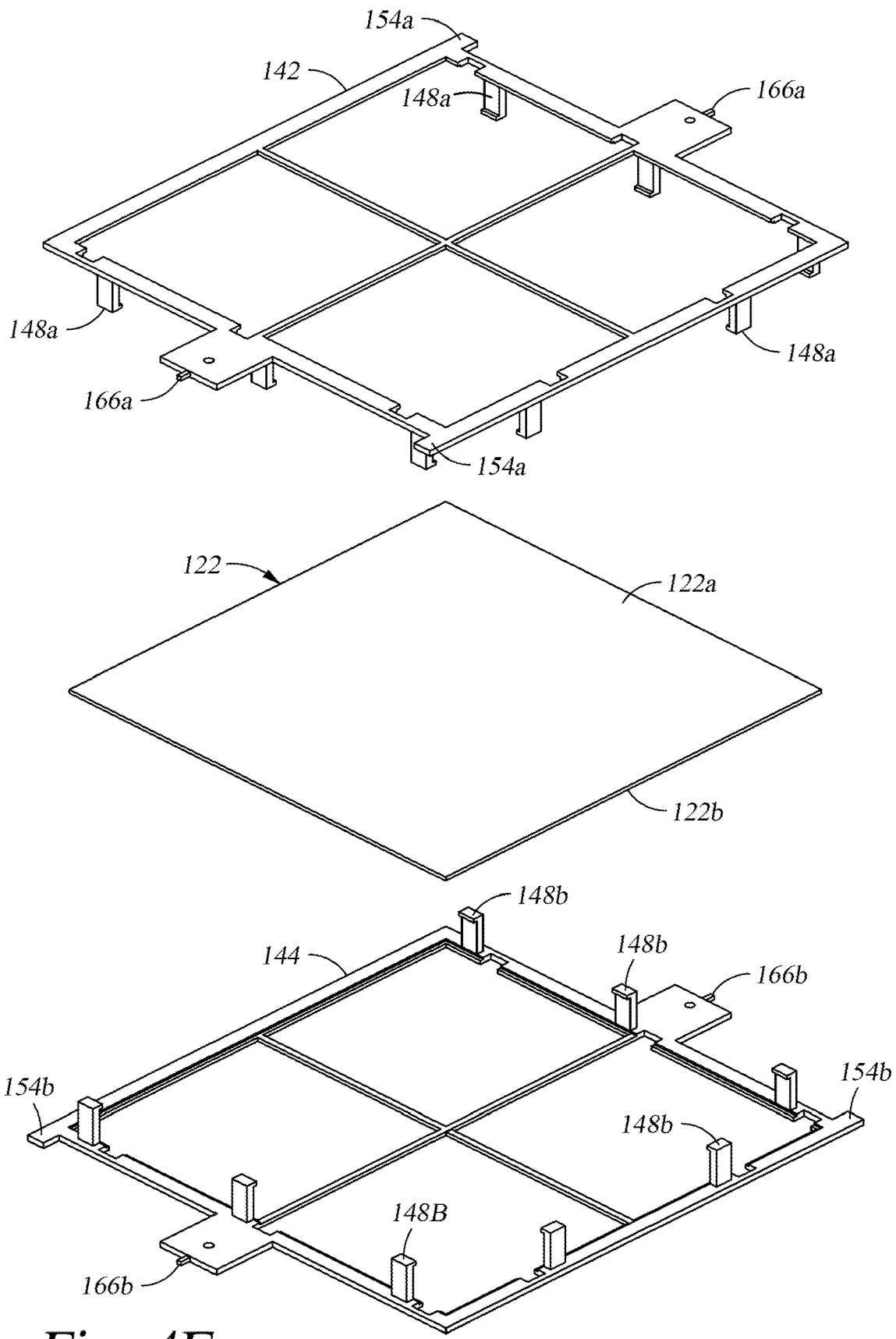
FIG. 4E is an exploded view of a clamp assembly, according to certain embodiments.

FIG. 4E is an exploded view of the clamp assembly 140, according to certain embodiments. As shown in FIG. 4E, the first and second plates 142, 144 each comprise a plurality of L-shaped pieces 148 (148a-b). The L-shaped pieces 148 of each respective plate collectively form a ledge for supporting an edge of the substrate 122. Each of the plurality of L-shaped pieces 148 extends from the respective plate in a direction perpendicular to the plane of the first plate 142. An edge of each of the first and second plates 142, 144 that is located closest to the transfer chamber 106 (e.g., a back left edge of each plate in the view shown in FIG. 4E) does not have L-shaped pieces 148 to enable loading of the substrate 122 from the transfer chamber 106.

Figure 4F:
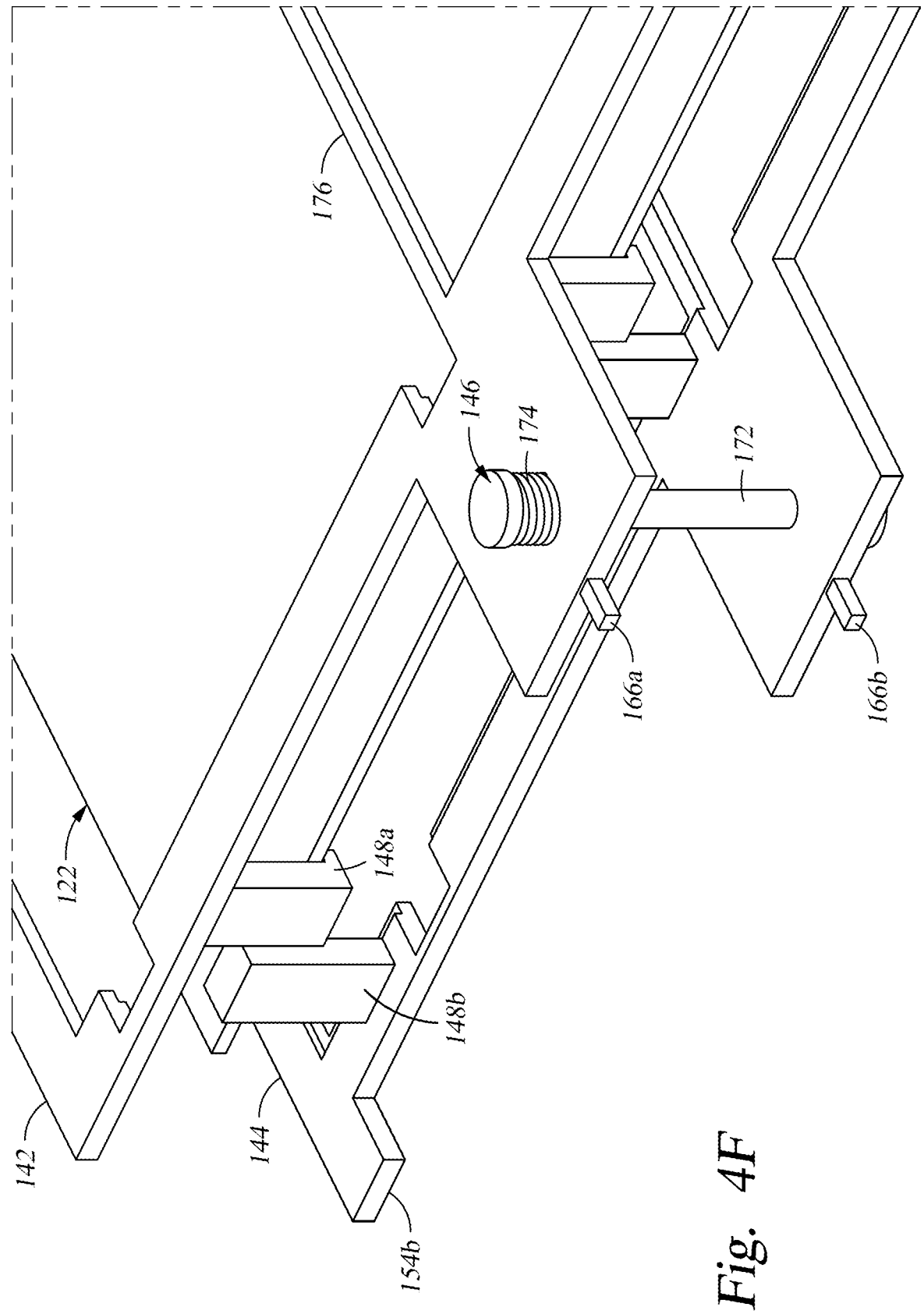
FIG. 4F is a top isometric view of a portion of the clamp assembly in the position shown in FIG. 4B, according to certain embodiments.

FIG. 4F is a top isometric view of a portion of the clamp assembly 140 in the position shown in FIG. 4B, according to certain embodiments. As shown in FIG. 4F, the second plate 144 is movably coupled to the first plate 142 in a direction perpendicular to a plane of the first plate 142. In the orientation shown in FIG. 4F, the first plate 142 is disposed above the second plate 144. The first and second plates 142, 144 are coupled together with a pair of spring-loaded connectors 146. The pair of spring-loaded connectors 146 biases the first and second plates 142, 144 towards each other to transition the first and second plates 142, 144 from an open position (shown in FIG. 4F) to a clamped position (shown in FIG. 5D). Each spring-loaded connector 146 includes a pin 172 disposed through corresponding apertures in the first and second plates 142, 144 and a pair of springs 174 disposed at opposite ends of the pin 172.

In the open position (shown in FIG. 4F), each of the plurality of L-shaped pieces 148 is disposed in a space between the first and second plates 142, 144 for loading the substrate 122 onto the ledge of one of the plates. In the orientation shown in FIG. 4F, the backside 122b of the substrate 122 is in contact with and supported from underneath by the L-shaped pieces 148a of the first plate 142.

Figure 5A:
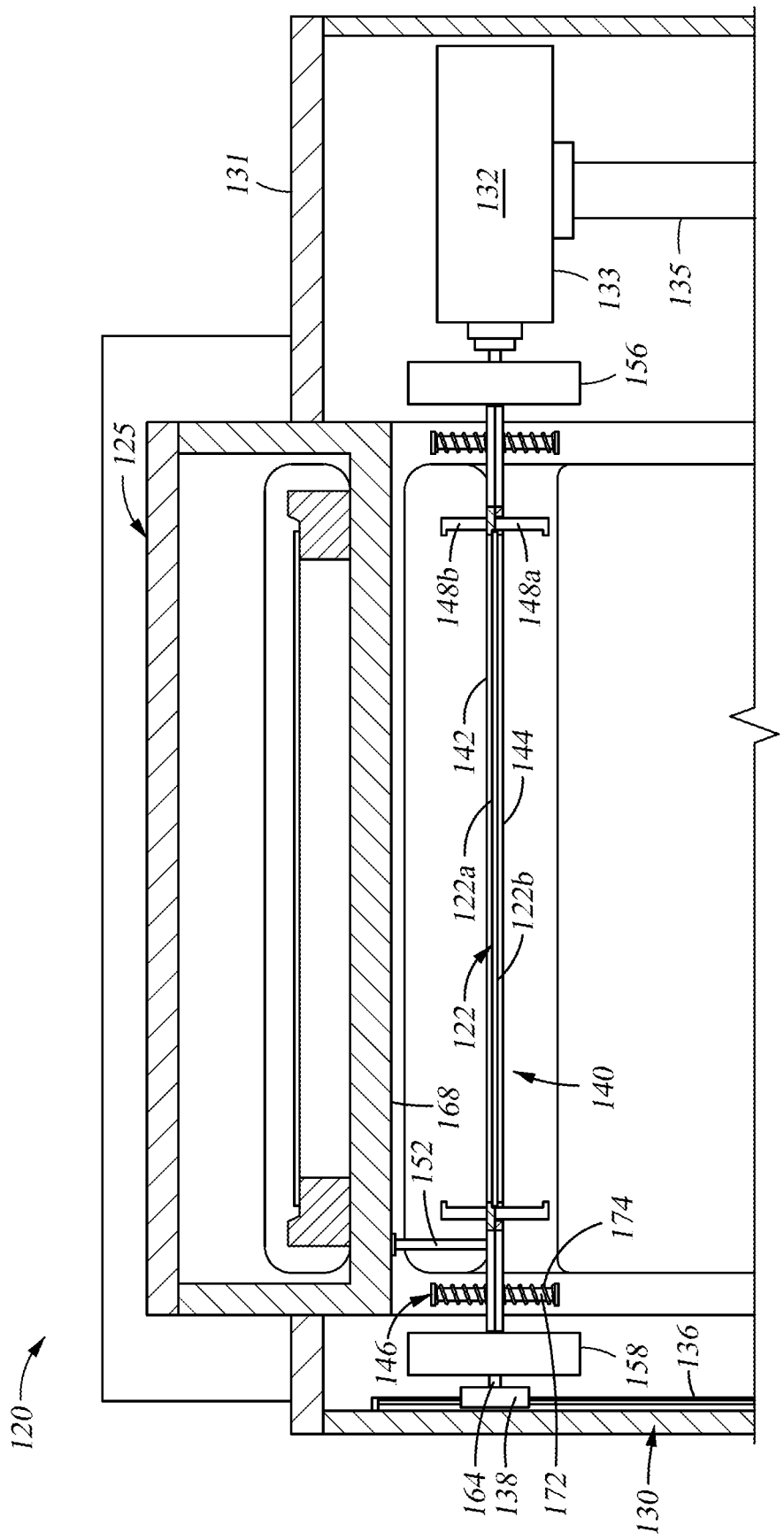
FIG. 5A is a partial side cross-sectional view of the flipper module in a clamped position, according to certain embodiments

FIG. 5A is a partial side cross-sectional view of the flipper module 130 of the second load lock chamber 120 in a clamped position, according to certain embodiments. As shown in FIG. 5A, at operation 204, the substrate 122 is secured in the clamp assembly 140. To move the first and second plates 142, 144 from the open position (shown in FIG. 4B) to the clamped position (shown in FIG. 5A), the actuator 135 of the second motor assembly 134 is retracted, which lowers the first motor assembly 132 and the first plate 142 relative to the second plate 144. The first plate 142 is biased towards the second plate 144 by the pair of spring-loaded connectors 146. As shown in FIG. 5A, the clamp assembly 140 is in a partly raised position. In the clamped position, the substrate 122 is in direct contact with the first and second plates 142, 144 to secure the substrate 122 therebetween. In the orientation shown in FIG. 5A, the front side 122a is in contact with the first plate 142, and the backside 122b is in contact with the second plate 144. In addition, the front side 122a is facing upwards, and the backside 122b is facing downwards.

Figure 5B:
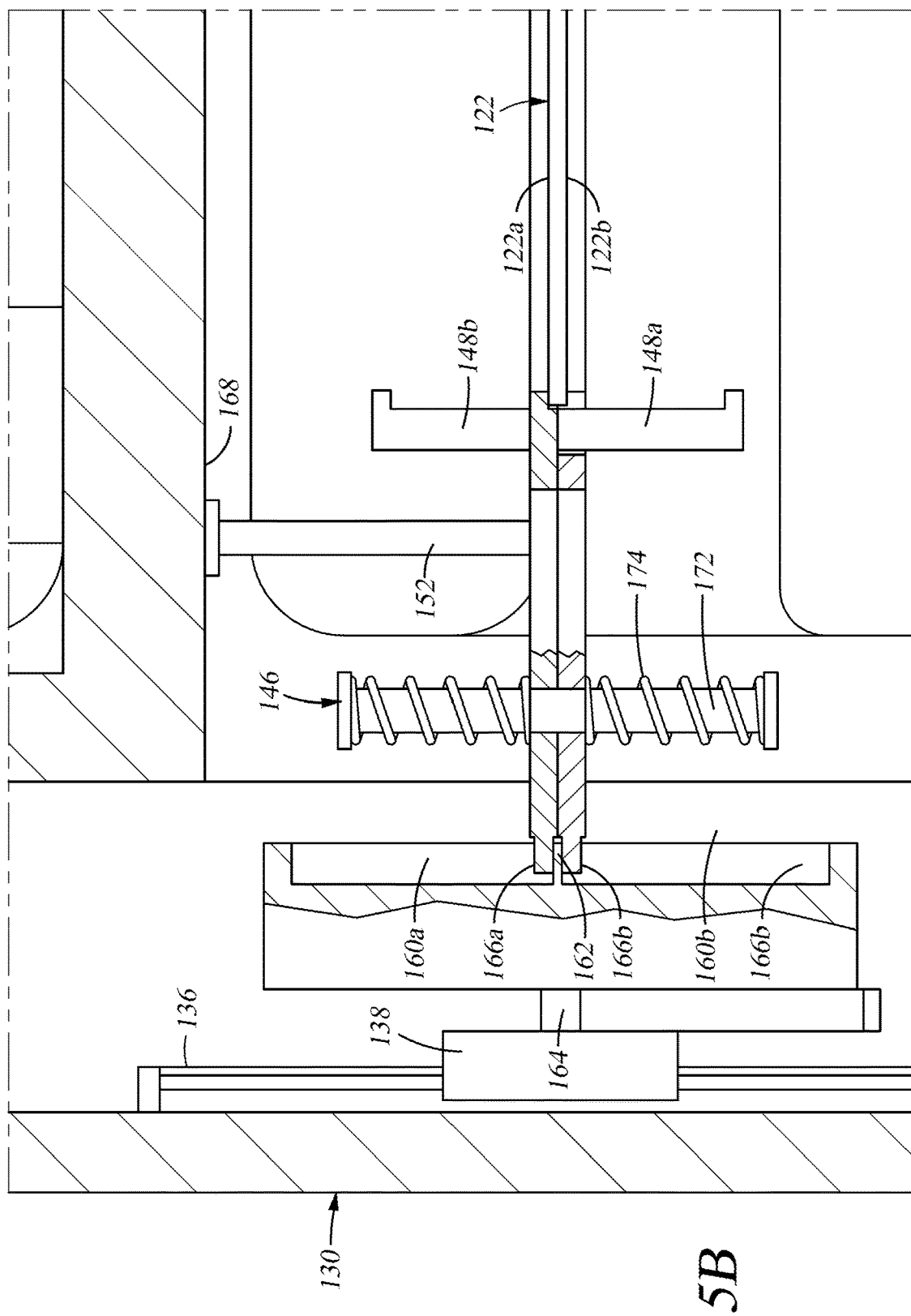
FIG. 5B is an enlarged view of a portion of FIG. 5A, according to certain embodiments.

FIG. 5B is an enlarged view of a portion of FIG. 5A, according to certain embodiments. As shown in FIG. 5B, in the clamped position, the pair of spring-loaded connectors 146 bias each of the first and second plates 142, 144 into contact with the wall 162, which centers the clamp assembly 140 in relation to the second guide block 158.

Figure 5C:
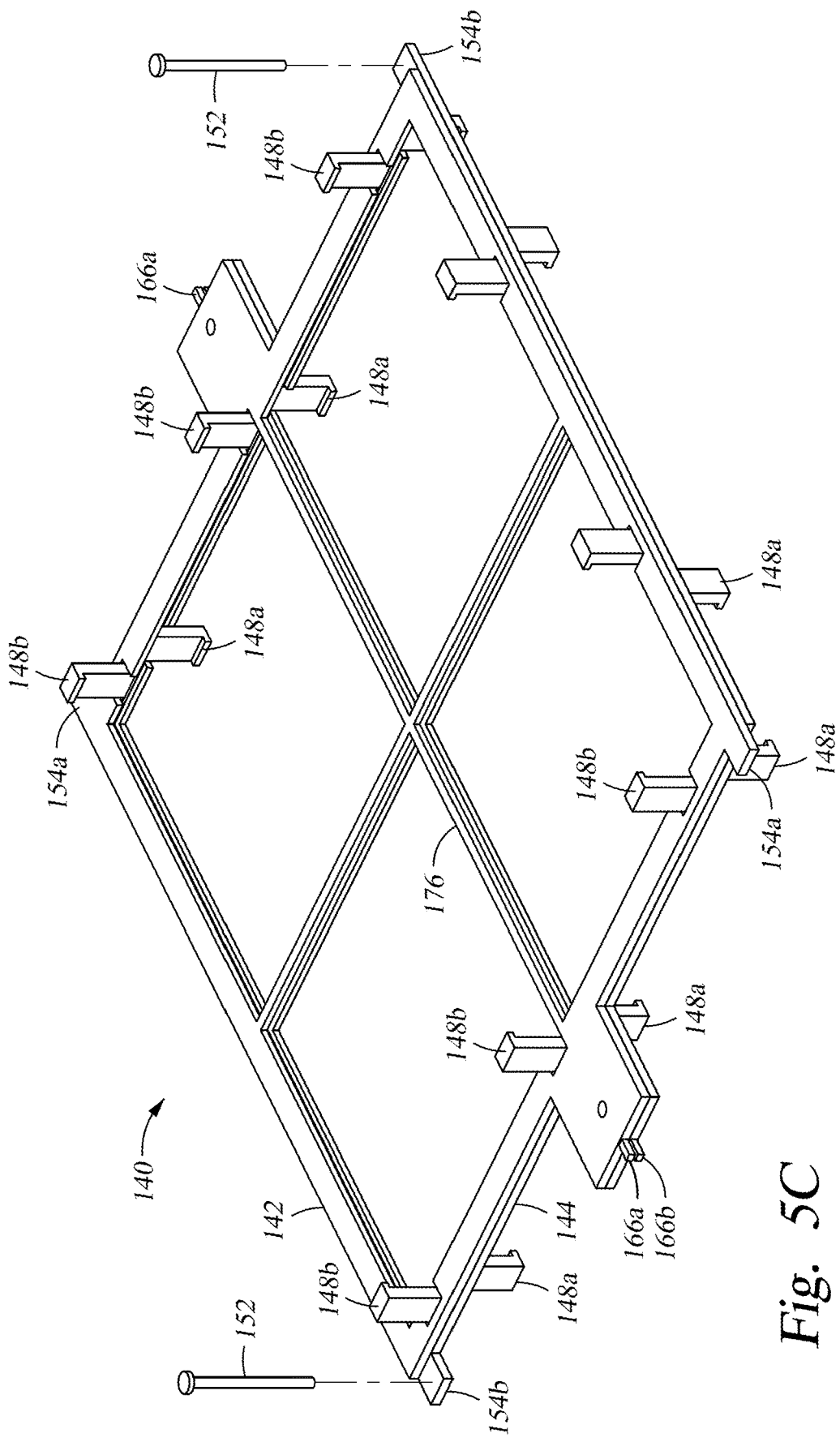
FIG. 5C is an isolated top isometric view of the clamp assembly, according to certain embodiments.

FIG. 5C is an isolated top isometric view of the clamp assembly 140, according to certain embodiments. As shown in FIG. 5C, the first and second plates 142, 144 each have a "+" shape backing 176 in contact with the substrate. However, other shapes are also contemplated. Therefore, contact between the substrate 122 and each respective plate is limited to only a relatively small cross-sectional area of the backing rather than contacting an entire area of the substrate 122.

Figure 5D:
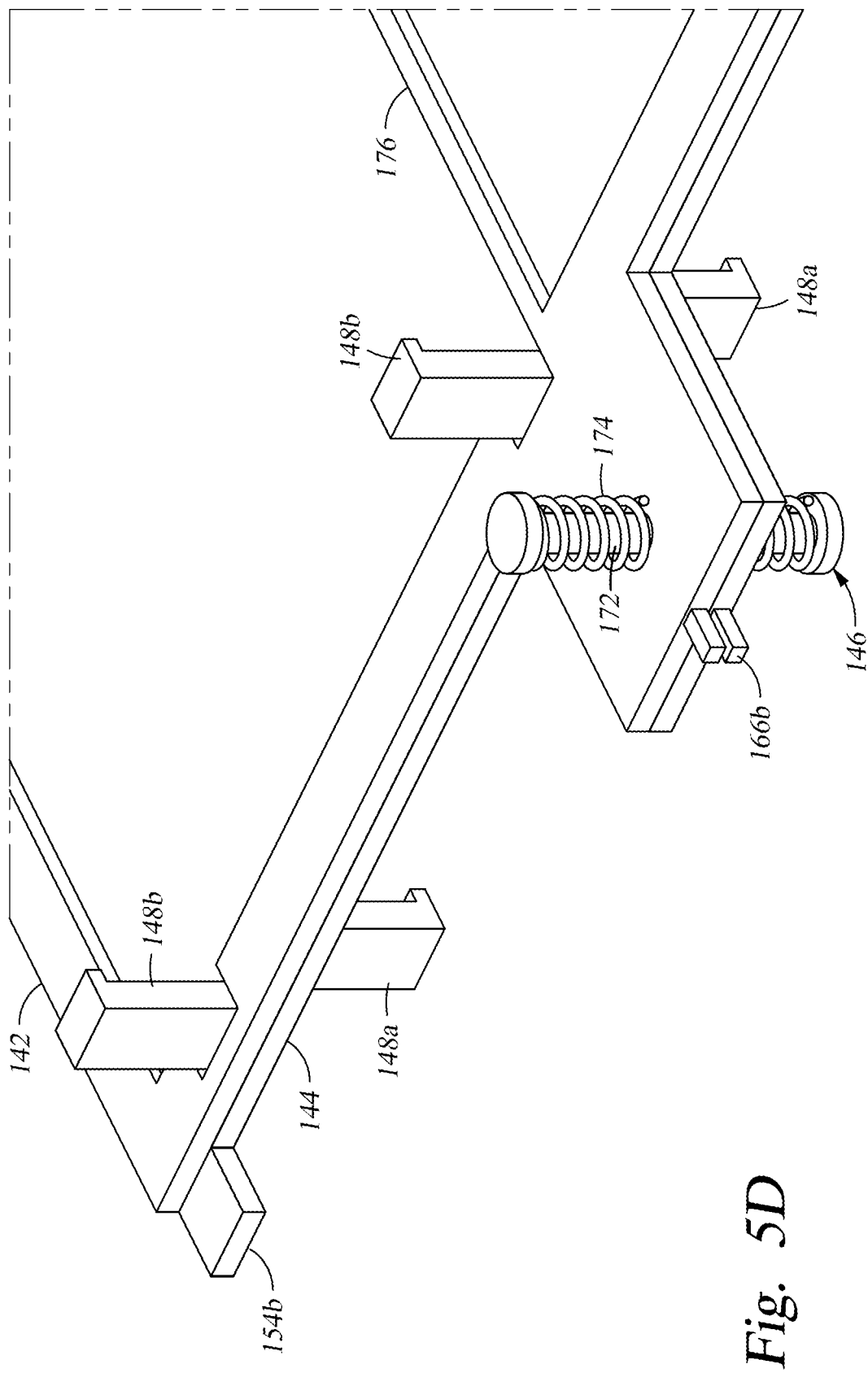
FIG. 5D is a top isometric view of a portion of the clamp assembly in the position shown in FIG. 5A, according to certain embodiments.

FIG. 5D is a top isometric view of a portion of the clamp assembly 140 in the position shown in FIG. 5A, according to certain embodiments. As shown in FIG. 5D, in the clamped position, each of the plurality of L-shaped pieces 148 is disposed through a corresponding opening in the opposite plate, which enables the first and second plates 142, 144 to be moved into close enough proximity to contact the substrate 122.

Figure 6:
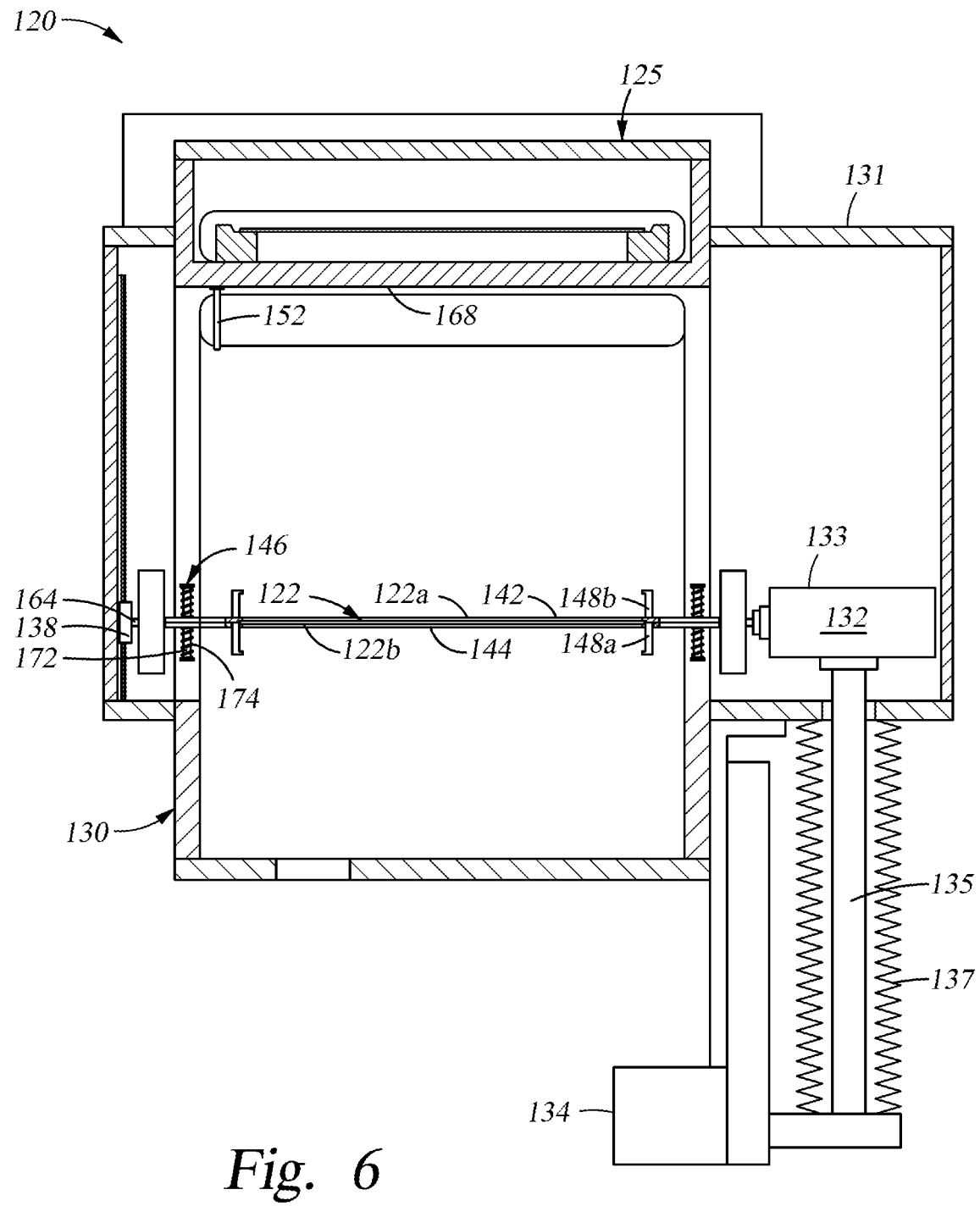
FIG. 6 is a partial side cross-sectional view of the flipper module at a flipping position of the method of FIG. 2, according to certain embodiments.

At operation 206, the clamp assembly 140 is lowered to a flipping position (shown in FIG. 6). To move the clamp assembly 140 to the flipping position, the actuator 135 of the second motor assembly 134 is further retracted below the partly raised position at which point contact between the second plate 144 and the pair of spring-loaded connectors 146 is released. Continued retraction of the actuator 135 lowers the first motor assembly 132 and the clamp assembly 140 coupled thereto. In certain embodiments, the second motor assembly 134 includes an electric or pneumatic motor with program stops at the fully raised position (shown in FIG. 4B) and the flipping position (shown in FIG. 6). In certain embodiments, the motor includes a gear drive or belt drive. In certain embodiments, the second motor assembly 134 includes an electric or pneumatic linear actuator. However, other types of actuators are also contemplated.

Figure 7:
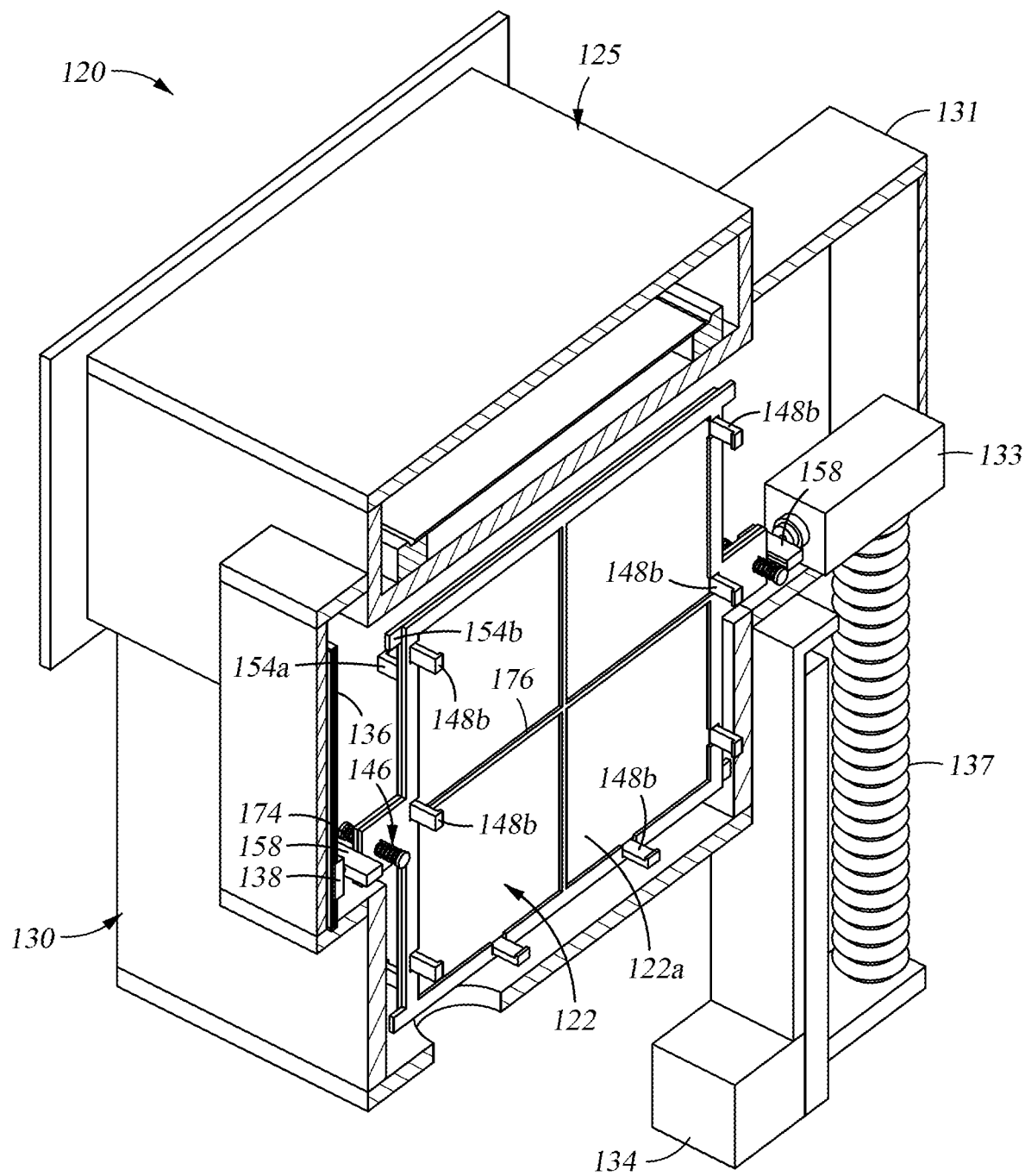
FIG. 7 is a top isometric view of the flipper module at yet another stage of the method of FIG. 2, according to certain embodiments.
Figure 8:
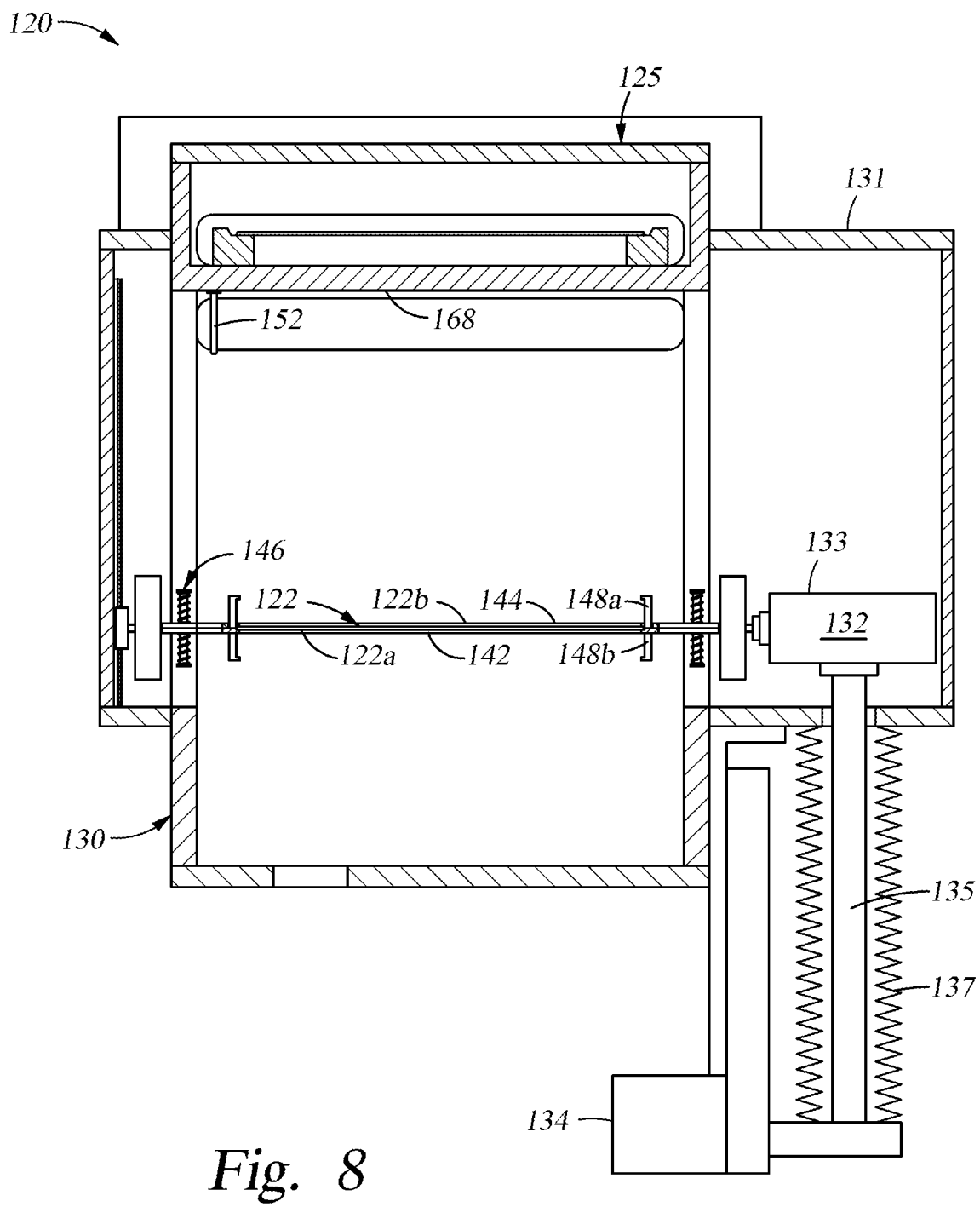
FIGS. 8-10 are partial side cross-sectional views of the flipper module at yet other stages of the method of FIG. 2, according to certain embodiments.

At operation 208, the clamp assembly 140 is rotated by about 180°. FIG. 7 is a top isometric view of the flipper module 130 of the second load lock chamber 120 illustrating the orientation of the clamp assembly 140 at 90° rotation. FIG. 8 is a partial side cross-sectional view of the flipper module 130 at 180° rotation. The clamp assembly 140 is rotated through actuation of the first motor assembly 132. In certain embodiments, the first motor assembly 132 includes an electric or pneumatic motor with program stops every 180°. In certain embodiments, the first motor assembly 132 includes a 180° electric or pneumatic actuator. However, other types of actuators are also contemplated. The orientation of the clamp assembly 140 and the substrate 122 secured therein are reversed after the clamp assembly 140 is rotated by about 180° (shown in FIG. 8). In the orientation shown in FIG. 8, the front side 122a is facing downwards, and the backside 122b is facing upwards. The front side 122a remains in contact with the first plate 142, and the backside 122b remains in contact with the second plate 144.

Figure 9:
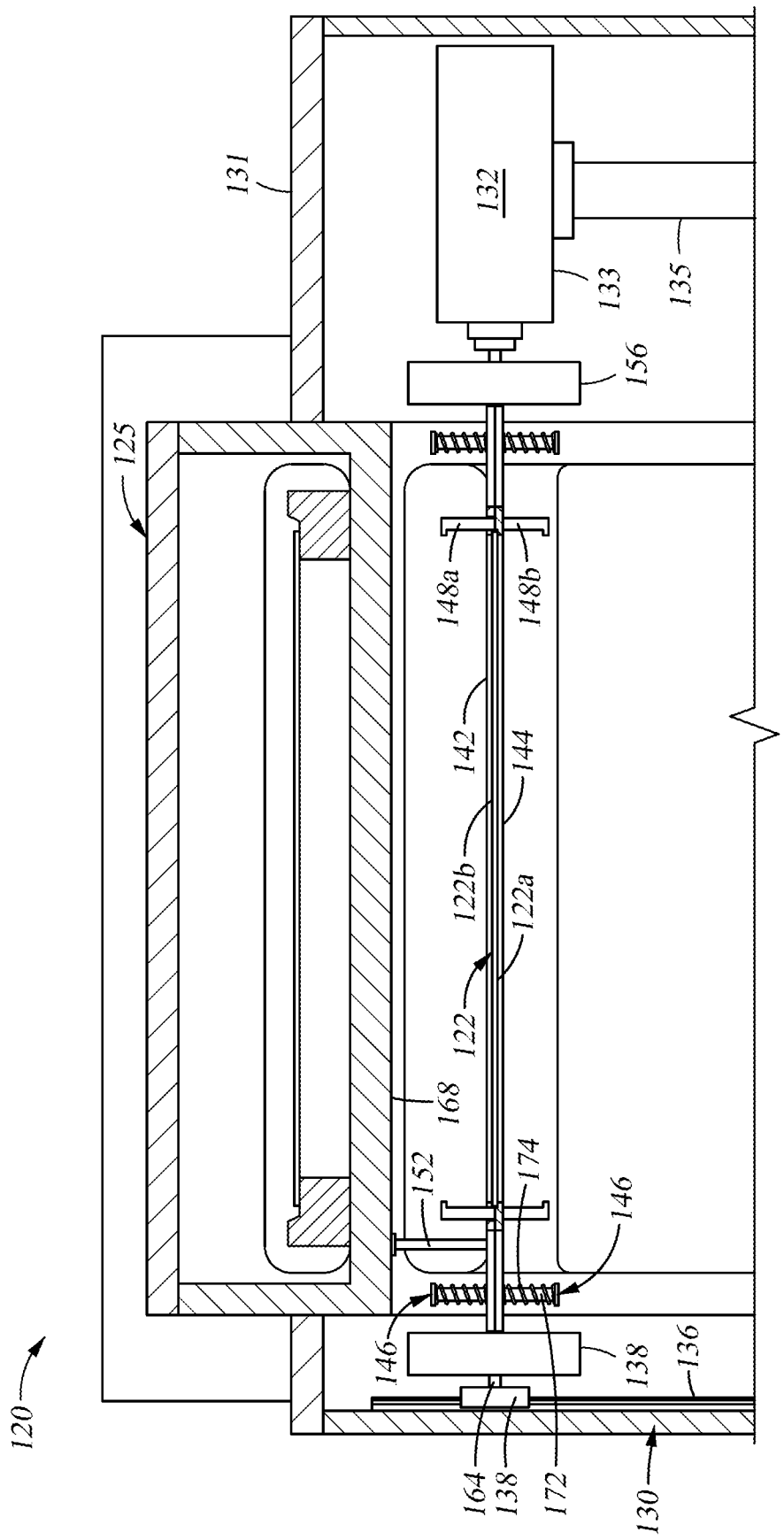

At operation 210, the clamp assembly 140 is raised to the partly raised position (shown in FIG. 9). To move the clamp assembly 140 to the partly raised position, the actuator 135 of the second motor assembly 134 is extended, which raises the first motor assembly 132 and the clamp assembly 140 coupled thereto. In the orientation shown in FIG. 9, the pair of lift pins 152 are in contact with the first plate 142 to hold the first plate 142 in a fixed position in relation to the upper surface 168 during subsequent raising of the second plate 144.

Figure 10:
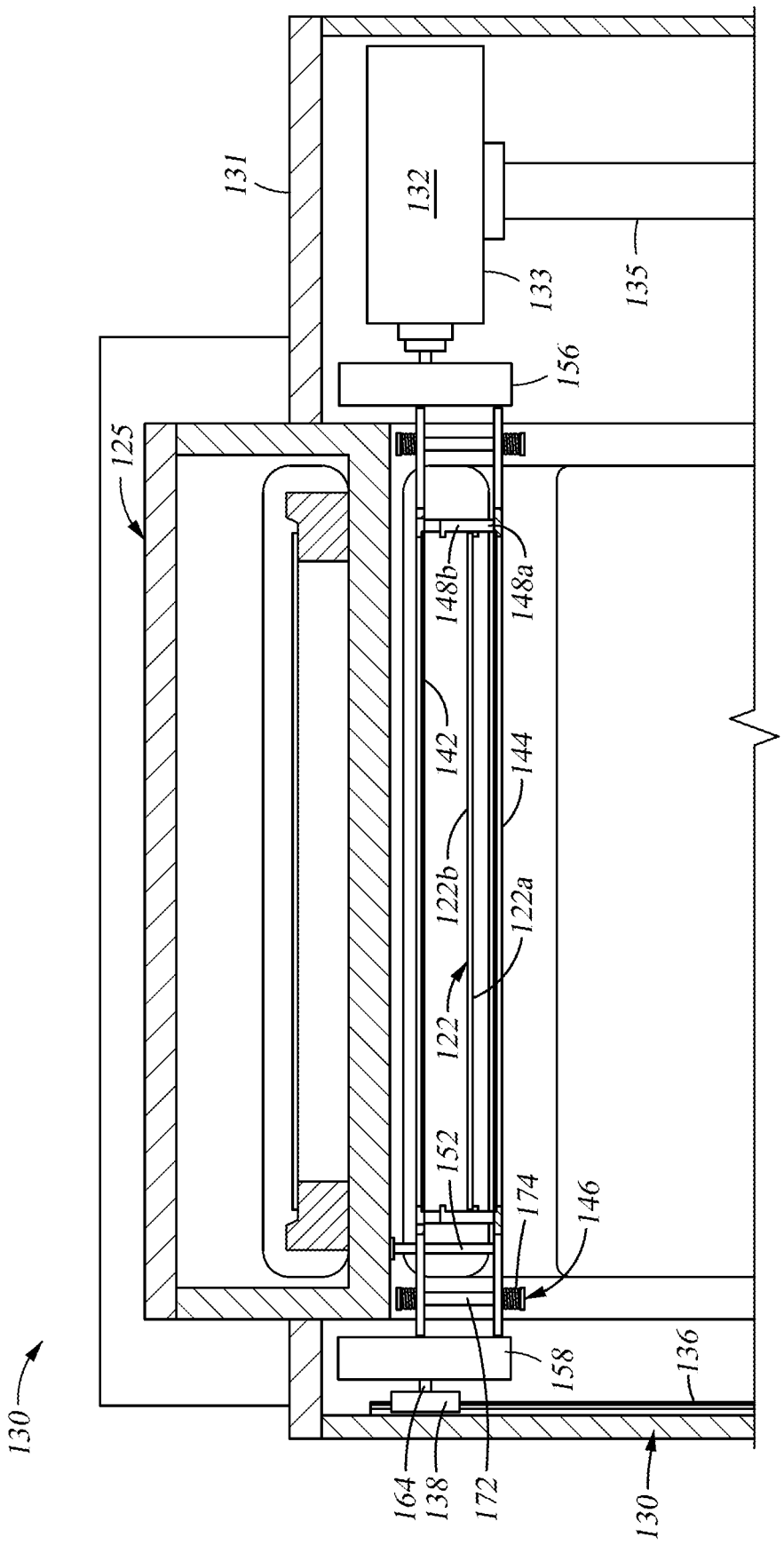

At operation 212, the substrate 122 is released from the clamp assembly 140 (shown in FIG. 10). To move the first and second plates 142, 144 from the clamped position (shown in FIG. 9) to the open position (shown in FIG. 10), the actuator 135 of the second motor assembly 134 is further extended, which raises the first motor assembly 132 and the second plate 144 relative to the first plate 142. The second plate 144 overcomes the biasing force applied by the pair of spring-loaded connectors 146. In the orientation shown in FIG. 10, the frontside 122a of the substrate 122 is in contact with and supported from underneath by the L-shaped pieces 148b of the second plate 144.

At operation 214, the substrate 122 is transferred out of the flipper module 130. When the substrate 122 is transferred back into the transfer chamber 106 after flipping in the flipper module 130, the backside 122b is facing upwards so that preclean and deposition processes can be performed on the backside 122b. As described above, the substrate 122 is maintained in vacuum during each operation of the method 200. Therefore, when the substrate 122 is transferred back into the transfer chamber 106, there is no need for degassing of the substrate 122 prior to performing subsequent preclean and deposition processes on the backside 122b. This results in a significant time savings and increased throughput for dual sided processing.

While the foregoing is directed to embodiments of the present disclosure, other and further embodiments of the disclosure may be devised without departing from the basic scope thereof, and the scope thereof is determined by the claims that follow.

What is claimed is:

1. A module of a processing system for flipping a substrate in vacuum, the module comprising:
   a clamp assembly for securing a substrate placed in a first plane;
   a first motor assembly coupled to the clamp assembly for rotating the clamp assembly around a first direction that is parallel to the first plane;
   a second motor assembly coupled to the first motor assembly for raising and lowering the first motor assembly and the clamp assembly in a second direction that is perpendicular to the first plane; and
   a slide coupled to the clamp assembly on a side opposite the first motor assembly in the first direction, wherein the slide comprises a bearing support that supports:
      rotation of the clamp assembly by the first motor assembly around the first direction through a rotatable bearing; and
      raising and lowering of the first motor assembly by the second motor assembly in the second direction.

2. The module of claim 1, wherein the clamp assembly, the first motor assembly, and the slide are each disposed in vacuum.

3. The module of claim 1, wherein the clamp assembly comprises:
   a first plate;
   a second plate parallel to the first plate, the second plate movably coupled to the first plate in the second direction; and
   a pair of spring-loaded connectors coupled to each of the first and second plates, the pair of spring-loaded connectors biasing the first and second plates towards each other to a clamped position.

4. The module of claim 3, wherein the first and second plates each comprise a plurality of L-shaped pieces collectively forming a ledge for supporting an edge of the substrate, wherein:
   each of the plurality of L-shaped pieces extends from the respective plate in the second direction,
   in the clamped position, each of the plurality of L-shaped pieces is disposed through a corresponding opening in the opposite plate, and
   in an open position, each of the plurality of L-shaped pieces is disposed in a space between the first and second plates for loading the substrate onto the ledge of one of the first and second plates.

5. The module of claim 4, wherein the first and second plates each comprise an edge without L-shaped pieces to enable loading of the substrate.

6. The module of claim 3, wherein the module further comprises a pair of lift pins configured to contact one of the first or second plates for moving the clamp assembly to an open position.

7. The module of claim 1, further comprising:
   an actuator of the second motor assembly coupled to a body of the first motor assembly; and
   a bellows surrounding the actuator, wherein:
      the actuator and the body are disposed in vacuum, and
      the second motor assembly is disposed in atmosphere.

8. A processing system, comprising:
   a deposition chamber;
   a transfer chamber coupled to the deposition chamber; and
   a load lock chamber coupled to the transfer chamber, the load lock chamber comprising a module for flipping a substrate in vacuum, the module comprising:
      a clamp assembly for securing a substrate placed in a first plane;
      a first motor assembly coupled to the clamp assembly for rotating the clamp assembly around a first direction that is parallel to the first plane;
      a second motor assembly coupled to the first motor assembly for raising and lowering the first motor assembly and the clamp assembly in a second direction that is perpendicular to the first plane; and a slide coupled to the clamp assembly on a side opposite the first motor assembly in the first direction, wherein the slide comprises a bearing support that supports:
  rotation of the clamp assembly by the first motor assembly around the first direction through a rotatable bearing; and
  raising and lowering of the first motor assembly by the second motor assembly in the second direction.

9. The processing system of claim 8, wherein each of the deposition chamber, the transfer chamber, and the load lock chamber are at vacuum.

10. The processing system of claim 8, wherein the deposition chamber comprises a physical vapor deposition (PVD) chamber.

11. The processing system of claim 8, further comprising a pre-clean chamber coupled to the transfer chamber.

12. The processing system of claim 8, wherein the load lock chamber comprises a door for unloading the substrate from the processing system, the processing system further comprising another load lock chamber for loading another substrate into the processing system.

13. A method of flipping a substrate, comprising:
  receiving the substrate in a load lock chamber, the load lock chamber comprising a module for flipping the substrate, the module comprising:
    a clamp assembly for securing a substrate placed in a first plane;
    a first motor assembly coupled to the clamp assembly for rotating the clamp assembly around a first direction that is parallel to the first plane;
    a second motor assembly coupled to the first motor assembly for raising and lowering the first motor assembly and the clamp assembly in a second direction that is perpendicular to the first plane; and
    a slide coupled to the clamp assembly on a side opposite the first motor assembly in the first direction, wherein the slide comprises a bearing support that supports:
      rotation of the clamp assembly by the first motor assembly around the first direction through a rotatable bearing; and
      raising and lowering of the first motor assembly by the second motor assembly in the second direction; and
  flipping the substrate in vacuum.

14. The method of claim 13, further comprising:
  positioning the clamp assembly in a first raised position, the clamp assembly having a first plate disposed above a second plate;
  with the clamp assembly opened, receiving the substrate on the first plate, a front side of the substrate facing up;
  lowering the clamp assembly to a flipping position using the second motor assembly;
  rotating the clamp assembly by 180° using the first motor assembly; and
  raising the clamp assembly to a second raised position, wherein in the second raised position, the substrate is disposed on the second plate with the front side facing down.

15. The method of claim 14, wherein lowering the clamp assembly to the flipping position comprises lowering the first plate relative to the second plate to clamp the substrate between the first and second plates.

16. The method of claim 15, wherein lowering the first plate relative to the second plate comprises a pair of spring-loaded connectors biasing the first and second plates towards each other.

17. The method of claim 14, wherein raising the clamp assembly to the second raised position comprises raising the second plate relative to the first plate to open the clamp assembly.

18. The method of claim 17, wherein raising the second plate relative to the first plate comprises contacting the first plate with a pair of lift pins to maintain a position of the first plate as the second plate is raised.

* * * * *